United States Patent
Li et al.

(10) Patent No.: US 6,843,880 B2
(45) Date of Patent: Jan. 18, 2005

(54) ENHANCED ENDPOINT DETECTION FOR WET ETCH PROCESS CONTROL

(75) Inventors: Leping Li, Poughkeepsie, NY (US); Steven G. Barbee, Amenia, NY (US)

(73) Assignee: International Business Machines Corporation, Armonk, NY (US)

( * ) Notice: Subject to any disclaimer, the term of this patent is extended or adjusted under 35 U.S.C. 154(b) by 208 days.

(21) Appl. No.: 10/156,580

(22) Filed: May 24, 2002

(65) Prior Publication Data

US 2003/0217990 A1 Nov. 27, 2003

(51) Int. Cl.$^7$ .......................... G01N 27/02; G01N 27/46
(52) U.S. Cl. ........................ 156/345.16; 156/627.1
(58) Field of Search ................ 156/345.16, 345.25, 156/345.28, 627.1

(56) References Cited

U.S. PATENT DOCUMENTS

| | | | |
|---|---|---|---|
| 5,338,390 A | 8/1994 | Barbee et al. | |
| 5,394,084 A | 2/1995 | Snyder | |
| 5,445,705 A | 8/1995 | Barbee et al. | |
| 5,451,289 A | 9/1995 | Barbee et al. | |
| 5,456,788 A | 10/1995 | Barbee et al. | |
| 5,480,511 A | 1/1996 | Barbee et al. | |
| 5,489,361 A | 2/1996 | Barbee et al. | |
| 5,500,073 A | 3/1996 | Barbee et al. | |
| 5,501,766 A | 3/1996 | Barbee et al. | |
| 5,516,399 A | 5/1996 | Balconi-Lamica et al. | |
| 5,573,623 A | 11/1996 | Barbee et al. | |
| 5,573,624 A | 11/1996 | Barbee et al. | |
| 5,582,746 A | 12/1996 | Barbee et al. | |
| 5,659,492 A | 8/1997 | Li et al. | |
| 5,731,697 A | 3/1998 | Li et al. | |
| 5,788,801 A | 8/1998 | Barbee et al. | |
| 6,293,457 B1 | 9/2001 | Srivastava et al. | |

OTHER PUBLICATIONS

Badih El–Kareh, Fundamentals of Semiconductor Processing Technologies 1995, Kluwer Academic Publishers.

*Primary Examiner*—Gregory Mills
*Assistant Examiner*—Sylvia R. MacArthur
(74) *Attorney, Agent, or Firm*—Steven Capella

(57) ABSTRACT

Improved endpoint detection is obtained for wet etch and/or other chemical processes involving in situ measurement of bath impedance. The endpoint detection uses a measurement apparatus having a measurement circuit with a capacitor designed to alter the phase angle of the circuit. The capacitor is preferably a variable capacitor which is used to set the initial phase angle of the measurement circuit to about zero. The methods using the improved detection enable etch to be more precisely controlled even under conditions where noise would otherwise adversely impact determination of the endpoint.

7 Claims, 1 Drawing Sheet

ENHANCED ENDPOINT DETECTION FOR WET ETCH PROCESS CONTROL

BACKGROUND OF THE INVENTION

As integrated circuit devices increase in device density and the size of wafers used in integrated circuit manufacturing increase in size, there is a continued need for more precise manufacturing process control.

In wet processes (e.g., wet etching) used in some stages of integrated circuit manufacture, process endpoint control has been achieved by monitoring one or more electrical properties (e.g., impedance) in the liquid bath medium in which the wet process is conducted. The change of such electrical property (ies) is correlated with the actual state of the wafer(s) being processed such that the process can be terminated or altered when a target electrical property value and/or rate of change is achieved. Examples of such processes are described in U.S. Pat. Nos. 5,338,390; 5,445,705; 5,456,788; 5,501,766; 5,516,399; and 5,788,801, the disclosures of which are incorporated herein by reference.

While the known techniques provide some process control, there can be difficulty in interpretation of the electrical signal corresponding to the monitored electrical property. For example, noise or scatter may be present in the signal such that the actual value of the electrical property and/or the rate of change (slope) are difficult to determine accurately. This problem can lead to operator and/or machine error in interpreting when to stop the wet process of interest such that the ideal manufacturing result is not achieved.

Thus, there is a need for improved monitoring techniques and apparatus to provide better electrical property monitoring to enable consistent selection of the desired process endpoint.

SUMMARY OF THE INVENTION

The invention provides apparatus and methods for detecting changes in wet processes. The apparatus and methods of the invention are especially useful where noise otherwise makes electrical property monitoring problematic. The apparatus and methods of the invention are characterized by the use of a capacitor to adjust the phase angle of the electrical circuit used to monitor an electrical property (especially impedance) of the liquid medium used in the wet process. The apparatus and methods of the invention are especially useful where the effective phase angle of the circuit can be set at or close to zero at the start of the wet process of interest.

In one aspect, the invention provides an apparatus for detecting a change in impedance in a liquid medium, the apparatus comprising an electrical circuit having a capacitor, at least two electrodes for placement in the liquid medium, a source of alternating electrical current, and a detector for measurement of impedance across the electrodes as a function of time. The capacitor is preferably a variable capacitor which enables adjustment of the phase angle of the circuit relative to the frequency of the applied current. The adjustable capacitor preferably can be adjusted to provide a circuit phase angle of zero at the start of a wet process where the apparatus of the invention is used for process control. The apparatus of the invention enables improved methods of controlling wet processes, especially wet etch processes.

In another aspect, the invention encompasses a method of controlling a process for wet etching a wafer, the method comprising:

(a) providing a container with a liquid etch medium, (b) providing an apparatus for detecting a change in impedance in the liquid medium, the apparatus comprising an electrical circuit having a variable capacitor, at least two electrodes placed in the liquid medium, a source of alternating electrical current, and a detector for measurement of impedance across the electrodes as a function of time, (c) applying an alternating current to the circuit and adjusting the variable capacitor until the circuit exhibits a desired phase angle, (d) immersing at least one wafer in the liquid medium whereby the etching process is initiated, a surface of the immersed wafer being proximate to the electrodes, and (e) monitoring the detected impedance as a function of time.

The capacitor adjustment preferably results in a phase angle of about zero at the beginning of the wet process. The method of the invention is especially useful for monitoring wet etching processes such as wet etching of TiW.

The invention further encompasses a method of patterning a material layer on a substrate, the method comprising:

(a) providing a substrate having a partially masked material layer, (b) providing a liquid etchant medium in a container, (c) providing apparatus for detecting a change in impedance in the liquid medium, the apparatus comprising an electrical circuit having a variable capacitor, at least two electrodes for placement in the liquid medium, a source of alternating electrical current, and a detector for measurement of impedance across the electrodes as a function of time, (d) contacting the electrodes with the liquid medium, (e) adjusting the variable capacitor to change a phase angle of the circuit of at a provided frequency of alternating electrical current, (f) positioning a surface of the substrate proximate to the electrodes in the liquid etchant medium, and (g) etching the substrate until a desired impedance condition is achieved in the circuit.

The invention also encompasses computer programs in a computer or computer-readable medium for carrying out the endpoint determination and process control aspects of the invention.

These and other aspects of the invention are discussed in further detail below.

DETAILED DESCRIPTION OF THE INVENTION

Figure 1:
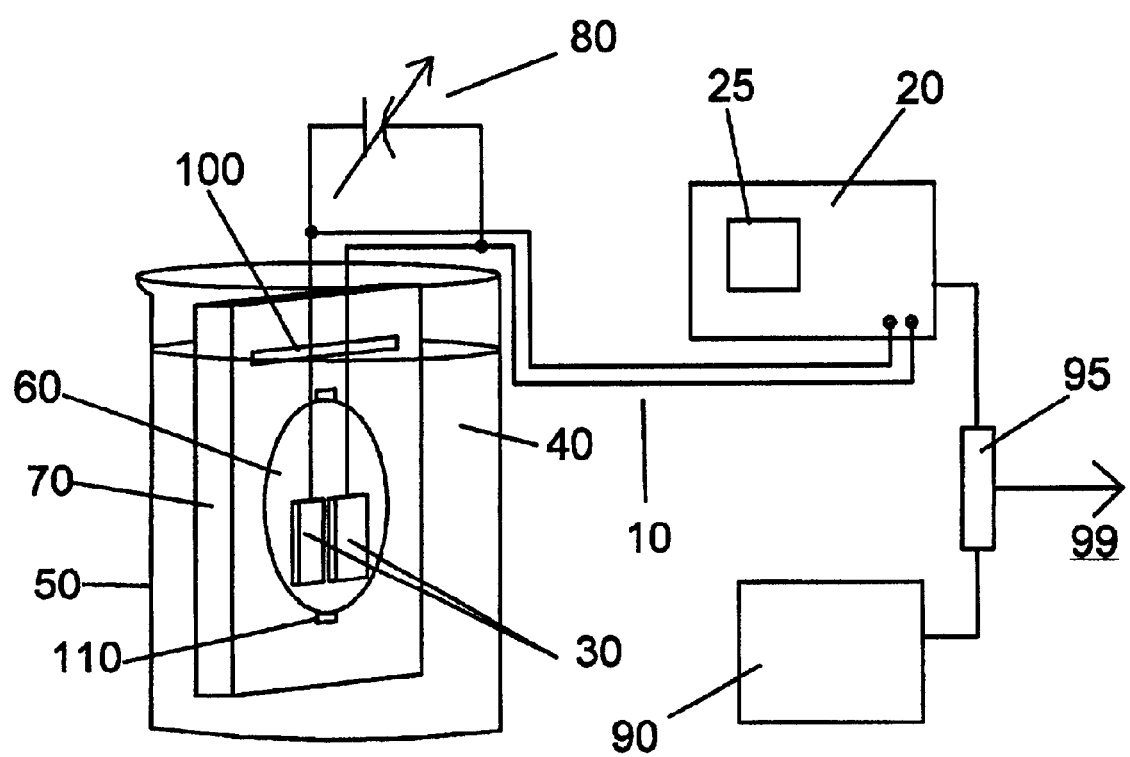
FIG. 1 is a schematic layout of an apparatus according to an embodiment of the invention.

The invention provides apparatus and methods for detecting changes in wet processes. The apparatus and methods of the invention are especially useful where noise otherwise makes electrical property monitoring problematic. The apparatus and methods of the invention are characterized by the use of a capacitor to adjust the phase angle of the electrical circuit used to monitor an electrical property (especially impedance) of the liquid medium used in the wet process. The apparatus and methods of the invention are especially useful where the phase angle of the circuit can be set at or close to zero at the start of the wet process of interest.

Referring to FIG. 1, the apparatus of the invention generally comprises an electrical circuit 10 which is driven by an alternating current source 20 (e.g., an impedance (LCR) meter). The circuit 10 further includes at least two electrodes 30 for immersion in a liquid medium 40 (preferably an aqueous etch medium) in a container 50. The apparatus of the invention may be used with any suitable workpiece to be etched, however, the apparatus is preferably adapted for use in wafer etch processes. In FIG. 1, wafer 60 is held in holder 70 which is immersed in liquid medium 40. The electrodes 30 are preferably in close proximity to, but not touching, the wafer 60.

The circuit 10 is preferably further characterized by the presence of a variable capacitor 80; more preferably the capacitor 80 is in parallel with the path formed by electrodes 30 through the liquid medium 40. The variable capacitor 80 may be adjusted directly at the capacitor and/or control may be integrated with another control device such as a programmed controller or a computer 90 interfaced through a general purpose interface bus (GPIB) 95 or through other suitable device configurations. The adjustment of variable capacitor 80 may be done manually, e.g., where the LCR meter 20 contains an oscilloscope function 25 (or other frequency comparison function) that permits determination of the phase relationship between the applied current to the detected current. Typically, LCR meter 20 would also contain circuitry adapted to analyze the detected current to determine the impedance values as a function of time during the process of interest.

The impedance values can then be processed, preferably using an endpoint program of the invention which preferably resides in computer 90. The program acquires the impedance data (total amplitude and phase angle). The program processes the impedance data to determine when an endpoint reference (e.g., a turning point of the impedance values with respect to time) is achieved. Once the endpoint reference is detected, the program preferably adds an appropriate amount of over-etch time to determine when to send a stop signal (e.g., through control signals 99 sent from GPIB 95) to remove the wafer from contact with the liquid medium or otherwise stop and/or change the process as desired.

In order to reduce noise in the impedance data, the program preferably makes the endpoint determination using a moving array average of impedance values, more preferably a double moving array average. In a single moving array, each impedance value used in the endpoint determination is actually a moving average $N_1$ of the $n_1$ most recent impedance values where $n_1$ is an integer value selected to provide noise reduction (curve smoothing) while minimizing loss of transient response. Preferably, $n_1$ is typically about 3–50, more typically about 5–10. In a moving array, the $N_1$ data value at time t is the average of the $n_1$ most recent values including the raw data value at time t. In the case of a double moving array, the $N_1$ data values are themselves averaged in a second moving array $N_2$ of the $n_2$ most recent $N_1$ values where $n_2$ is an integer, preferably about 3–50, more typically about 5–10. The use of double moving array average generally provides a better combination of noise reduction and transient response.

In some instances, especially where greater sensitivity is needed, a derivative of the impedance values may be used for endpoint determination. In such instances, preferably the a first derivative (with respect to time) of the $N_2$ impedance values is used, more preferably, a single or double moving array average of the $N_2$ values is used in calculation of the derivative.

The invention may be employed in wet processes where wafers are processed individually and/or where multiple wafers are processed simultaneously in the same bath. The apparatus configuration should have the allow for the electrodes of the electrical circuit to be in proximity to the surface of the wafer to be etched (i.e., sufficiently close that changes in the electrical characteristics of the liquid medium at the wafer surface can be monitored), the invention is not limited to any specific wafer or wafer-holder configuration. Similarly, the invention is not limited to any specific electrode configuration apart from meeting the position criteria mentioned above. An example wafer holder 70 is shown where slot 100 is present to facilitate handling and recesses 110 are present to facilitate loading and unloading of the wafer(s) to be processed.

The invention encompasses a method of controlling a process for wet etching a wafer, the method comprising:
(a) providing a container with a liquid etch medium,
(b) providing an apparatus for detecting a change in impedance in the liquid medium, the apparatus comprising an electrical circuit having a variable capacitor, at least two electrodes placed in the liquid medium, a source of alternating electrical current, and a detector for measurement of impedance across the electrodes as a function of time,
(c) applying an alternating current to the circuit and adjusting the variable capacitor until the circuit exhibits a desired phase angle,
(d) immersing at least one water in the liquid medium whereby the etching process is initiated, a surface of the immersed wafer being proximate to the electrodes, and
(e) monitoring the detected impedance as a function of time.

This method of the invention preferably involves using the apparatus and averaging described above. The liquid medium is preferably a wet etch medium adapted to etch a material on a wafer surface. Examples of wet etch processes are those used for TiW etch (see U.S. Pat. No. 6,293,457 the disclosure of which is incorporated herein by reference). The method is not limited to any specific liquid medium or processing step as long as an impedance change occurs which can be correlated to a control point of the process. In the method, the variable capacitor is preferably adjusted achieve a phase angle for the circuit of less than about 0.25 radians (approx. 15°), more preferably less than 0.1 radians, most preferably about zero radians. This adjustment is preferably done around the start of the process to be controlled. The method preferably further comprises removing the wafer from contact with the liquid medium in response to a behavior of the monitored impedance.

The invention also encompasses a method of patterning a material layer on a substrate, the method comprising:
(a) providing a substrate having a partially masked material layer,
(b) providing a liquid etchant medium in a container,
(c) providing apparatus for detecting a change in impedance in the liquid medium, the apparatus comprising an electrical circuit having a variable capacitor, at least two electrodes for placement in the liquid medium, a source of alternating electrical current, and a detector for measurement of impedance across the electrodes as a function of time,
(d) contacting the electrodes with the liquid medium,
(e) adjusting the variable capacitor to change a phase angle of the circuit of at a provided frequency of alternating electrical current,
(f) positioning a surface of the substrate proximate to the electrodes in the liquid etchant medium, and (g) etching the substrate until a desired impedance condition is achieved in the circuit.

This method preferably uses the apparatus and techniques described above relative to the method of controlling wet etch. The partially masked material layer on the substrate may be a TiW layer such as described in the above mentioned U.S. Pat. No. 6,293,457. Alternatively, the layer may be of another material of interest (e.g., ceramic, metal or semiconductor) or may be the substrate material itself. The invention is especially useful where the material layer of interest is a metal. The masking may be provided by photoresist, hard mask or other patterned layers as is known in the art. The liquid etchant medium may be one of those described in the above mentioned patent or may be another composition suitable for etching the material layer of interest. See for example wet etch processes described in "Fundamentals of Semiconductor Processing Technologies" by Badih El-Kareh, Kluwer Academic Publishers, (1995), pages 272–281.

The computer programs of the invention preferably are embodied in a computer-readable medium. The programs are capable of at least the following steps: acquiring the impedance data as a function of time, calculating double moving array averages of the impedance data, determining whether the impedance data based on the double moving array averages meets an endpoint condition, and causing a control signal to be sent to apparatus performing the process of interest. The program is also preferably capable of performing the derivative calculations described above and determining whether the derivative data meets an endpoint condition, and on that basis, causing a control signal to be sent to apparatus performing the process of interest.

What is claimed is:

1. An apparatus for detecting a change in impedance in a liquid medium, said apparatus comprising an electrical circuit having a capacitor, at least two electrodes for placement in said liquid medium, a source of alternating electrical current, a detector for measurement of impedance across said electrodes as a function of time, and a computing device for analyzing said detected impedance as a function of time wherein said computing device is programmed to calculate a first derivative of said detected impedance with respect to time and to perform moving array calculations using a moving array of detected impedance values.

2. The apparatus of claim 1 further comprising a container for said liquid medium.

3. The apparatus of claim 2 further comprising a holder in said container for at least one wafer.

4. The apparatus of claim 3 wherein said electrodes are located in sufficient proximity to a surface of said wafer whereby changes in impedance at said surface can be detected by said circuit.

5. The apparatus of claim 1 wherein said capacitor has a variable capacitance value.

6. The apparatus of claim 5 wherein said capacitor is capable of providing a capacitance to said circuit whereby said circuit has a phase angle of zero for a frequency of current provided by said alternating current source.

7. The apparatus of claim 1 wherein said computing device is programmed to perform double moving array calculations.

* * * * *